United States Patent [19]

Yoon et al.

[11] Patent Number: 5,702,975
[45] Date of Patent: Dec. 30, 1997

[54] METHOD FOR ISOLATING SEMICONDUCTOR DEVICE

[75] Inventors: Hyung-Sup Yoon; Jin-Hee Lee; Chul-Sun Park; Kwang-Eui Pyun, all of Daejeon, Rep. of Korea

[73] Assignee: Electronics and Telecommunications Research Institute, Daejeon, Rep. of Korea

[21] Appl. No.: 719,876

[22] Filed: Sep. 25, 1996

[30] Foreign Application Priority Data

Nov. 8, 1995 [KR] Rep. of Korea ............ 95-40297

[51] Int. Cl.[6] ........................................ H01L 21/302
[52] U.S. Cl. ........................ 437/61; 437/184; 437/89; 437/104
[58] Field of Search ................... 437/61, 89, 184, 437/185, 104

[56] References Cited

U.S. PATENT DOCUMENTS 4,954,457  9/1990  Jambotkar ............... 437/184
5,254,492  10/1993  Tserng et al. .......... 437/184
5,272,106  12/1993  Hirtz et al. ............. 437/89
5,629,215  5/1997  Goronkin et al. ....... 437/184

OTHER PUBLICATIONS

Characterization of Device Isolation in GaAs MESFET Circuits by Boron Implantation; F. Clauwaert, P. Van Daele, R. Baets, and P. Lagasse; Mar. 1987; pp. 711–714.
Elimination of Mesa–Sidewall Gate Leakage in InAlAs/InGaAs Heterostructures by Selective Sidewall Recessing; Sandeep R. Bahl and Jesus A. del Alamo; Apr. 1992; pp. 195–197.

*Primary Examiner*—Trung Dang
*Attorney, Agent, or Firm*—Antonelli, Terry, Stout & Kraus, LLP

[57] ABSTRACT

A method for isolating a semiconductor device is disclosed including the steps of sequentially growing a plurality of material layers on a semiconductor substrate, etching the material layers down to a predetermined depth of the substrate to thereby define an active region, forming a semi-insulating film on the exposed semiconductor substrate in order to planarize the step-difference of the active region and the isolation region, and then, forming an ohmic metal layer on a space where the semi-insulating film is regrown.

5 Claims, 4 Drawing Sheets

METHOD FOR ISOLATING SEMICONDUCTOR DEVICE

BACKGROUND OF THE INVENTION

The present invention relates to a method for manufacturing a field effect compound semiconductor device, and more particularly, to method for isolating a semiconductor device in which the semiconductor device is isolated by the regrowth method of a semi-insulating film, thereby enhancing the isolation characteristic of the device.

Recently, according to the development of the photo-telecom technology and the electronics industry technology using a semiconductor, the necessity for fields such as the transmission or recording of the information is increased more and more. Thus, researches into the compound semiconductor has been proceeding actively.

In general, since the compound semiconductor such as a GaAs or an InP has a high carrier mobility, it is widely used for field effect semiconductor devices such as a high electron mobility transistor (HEMT) and a metal-semiconductor field effect transistor (MESFET), and heterojunction bipolar transistors (HBTs).

Usually, as a conventional method for isolating such field effect GaAs semiconductor device, there is mainly used a method where a semiconductor substrate is etched to be recessed by a wet etching or a dry etching method.

As a conventional isolating method of the compound semiconductor device, there is a method where, in order to electrically isolate a MESFET device and the other electric parts from each other in GaAs high speed digital IC, a boron as an impurity for insulation is implanted into an isolation region to isolate the device and the electric parts (see: J. Electrochem. Soc. Vol. 134, pp. 711~714, 1987, "Characterization of device isolation in GaAs MESFET circuit by boron implantation"). Further, when a gate electrode is formed after defining an isolation region by a mesa etching method, the gate electrode and the InGaAs layer on the side of the mesa is in contact with each other to thereby generate a leakage current. Thus, as an isolating method of the compound semiconductor device for solving this problem, there is a method where, after mesa-etching a part being formed as the isolation region, the InGaAs layer on the side of the mesa is a little more selectively etched by using an etchant that can selectively etch the InGaAs layer, so that the gate electrode is not in contact with the mesa layer (see: IEEE Electron Device Lett. Vol. 13, pp. 195~197, 1992, "Elimination of mesa-side wall gate in InGaAs heterostructure by selective sidewall recessing". However, according to the aforementioned conventional device isolating method, after etching the recess part, the side of an active region is exposed and the gate electrode passes by the recess part, thereby forming the path of leakage current. Thus, there is caused a problem that the isolating characteristic of the semiconductor device is deteriorated.

Further, in case that the compound semiconductor device is isolated by the etching of the deep recess part, a large step-difference is inevitably caused in the semiconductor substrate. Due to such high step-difference, the electrode is shorted during the process of the electrode interconnection.

FIGS. 1 to 5 show an isolating method of a GaAs field effect semiconductor device according to the conventional method, sequentially by stages.

Referring to FIG. 1, a buffer layer 12, a channel layer 13, a spacer layer 14, a schottky layer 15 and an ohmic layer 16 are sequentially stacked on a semi-insulating GaAs substrate 11.

Then, as shown in FIG. 2, in order to define an active region, a photoresist film pattern 17 is formed on a predetermined region of ohmic layer 16. The material layers sequentially formed from ohmic layer 16 are etched, thereby etching semi-insulating GaAs substrate 11 to a predetermined depth.

For example, after forming photoresist film pattern 17 for defining the active region on the predetermined region of ohmic layer 16, using photoresist film pattern 17 as an etching mask, ohmic layer 16, schottky layer 15, spacer layer 14, channel layer 13, buffer layer 12 and substrate 11 are partially etched in order, thereby defining the active region and an isolation region of the device.

At this time, in FIG. 2, these layers are etched so as to have a mesa structure or a vertical sidewall.

Then, after removing photoresist film pattern 17, the ohmic metal is patterned by a lithography process, thereby forming an ohmic metal layer 18 that is in contact with exposed GaAs substrate 11 and the side of material layers 12 to 16.

As shown in FIG. 4, a part of the center region of GaAs ohmic layer 16 is etched to form a gate electrode 19 on exposed schottky layer 15 and to form source and drain electrodes 20 on ohmic metal layer 18. As a result, a field effect compound semiconductor device such as HEMT and MESFET is formed.

At this time, FIG. 5 shows a cross-sectional view of FIG. 4, in which gate electrode 19 part is taken in a vertical direction.

In the recess isolating method of a semiconductor device according to the conventional method, since the step-difference of the active region and the isolation region where the substrate is etched is high, gate electrode 19 is shorted during passing the isolation region. operation. Further, as shown in FIG. 5, since gate electrode 19 is in contact with channel layer 13, a leakage current flows between the gate and the source/drain, thereby deteriorating the electric characteristic of device.

SUMMARY OF THE INVENTION

In order to solve the aforementioned problems, it is an object of the present invention to provide a method for isolating a semiconductor device in which, using a method of regrowing an isolation region of a field effect compound semiconductor device, an active region and the isolation region are planarized and simultaneously, an electric characteristic of device is improved.

To accomplish the object of the present invention, there is provided a method for isolating a semiconductor device comprising the steps of (a) sequentially growing a plurality of material layers on a semiconductor substrate, (b) etching the material layers down to a predetermined depth of the substrate to thereby define an active region using double insulating films comprised of a oxide and nitride film, (c) forming a semi-insulating film on the exposed semiconductor substrate in order to planarize the step-difference of the active region and the isolation region, and (d) forming an ohmic metal layer on a space where the semi-insulating film is regrown.

In the present invention, a mask pattern for defining the active region is comprised of a double insulating film pattern in which an oxide film and a nitride film are stacked so as to obtain a vertical etching sectional profile.

Further, as the method of selectively regrowing the semi-insulating film on the etched isolation region, it is desirable to use a metal organic chemical vapor deposition (MOCVD) method.

According to a preferred embodiment of the present invention, the leakage current characteristic and the breakdown voltage characteristic are enhanced as compared to the conventional recess isolating method, thereby enhancing the electric characteristic of the device. In addition, the active region and the isolation region of the device can be planarized.

The aspects, characteristics and advantages of the present invention will be obvious by the following detail description of referring the attached drawings.

BRIEF DESCRIPTION OF THE ATTACHED DRAWINGS

FIGS. 1 to 5 are cross-sectional views for illustrating a method for isolating a compound semiconductor device according to the conventional method; and FIGS. 6 to 11 are cross-sectional views for illustrating a method for isolating a compound semiconductor device according to the present invention.

DETAILED DESCRIPTION OF THE INVENTION

FIGS. 6 to 11 are cross-sectional views for illustrating a method for isolating a compound semiconductor device according to the present invention.

Hereinafter, an embodiment of the present invention will be described with reference to FIGS. 6 to 11.

Figure 1:
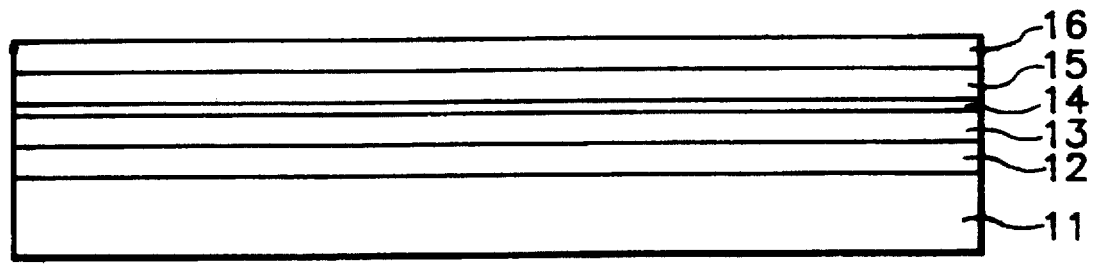
Figure 2:
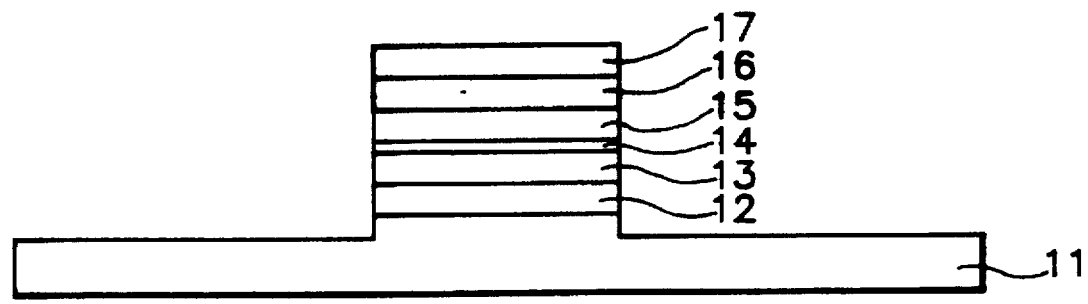
Figure 3:
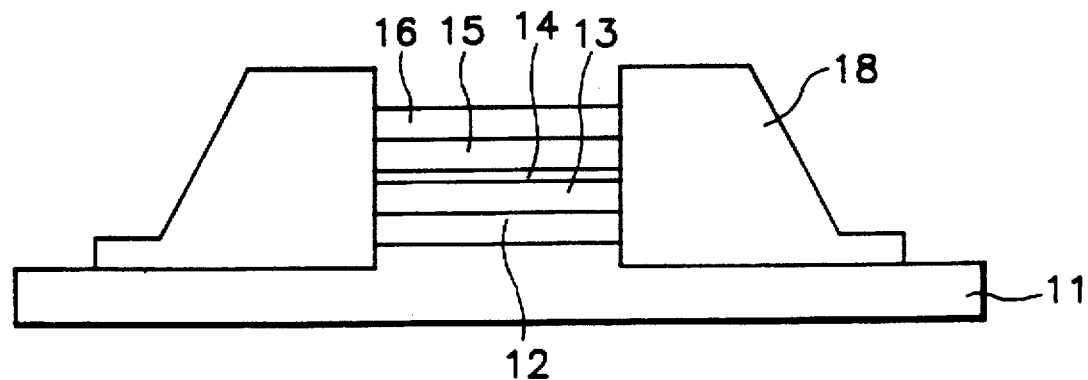
Figure 4:
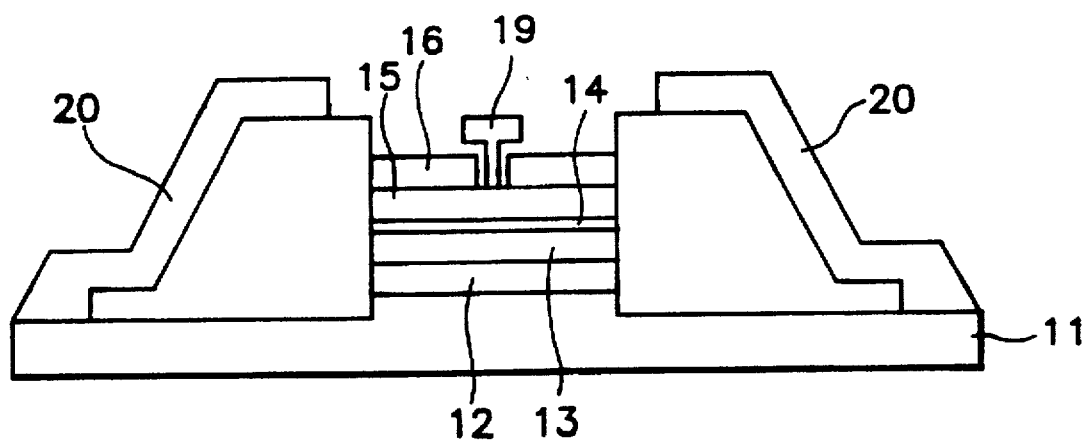
Figure 5:
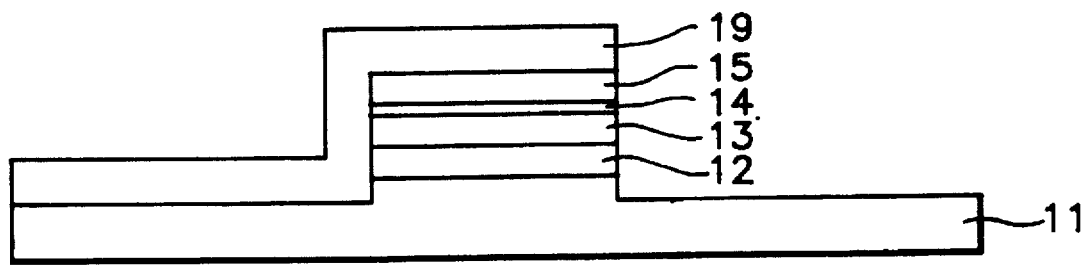
Figure 6:
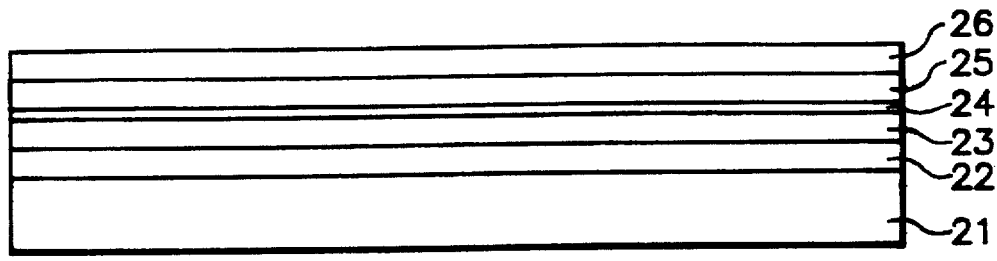

Referring to FIG. 6, on a GaAs substrate 21, semiconductor material layers, e.g., a buffer layer 22, a channel layer 23, a spacer layer 24, a schottky layer 25 and a highly doped N-type ohmic layer 26, are grown sequentially.

Figure 7:
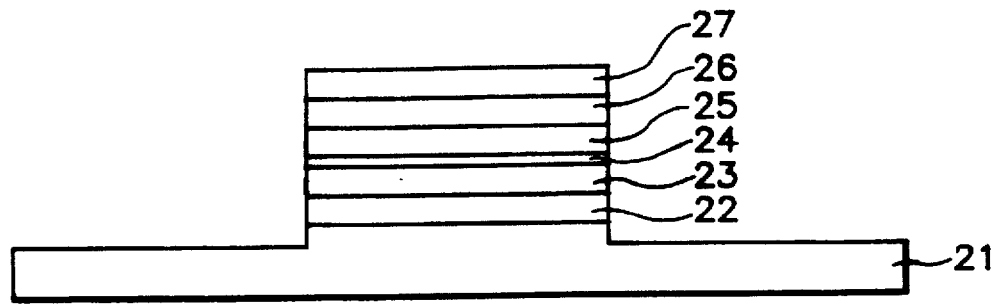

Then, as shown in FIG. 7, after forming mask pattern 27 on the predetermined region of ohmic layer 26 for defining the active region, using mask pattern 27 as an etching mask, ohmic layer 26, schottky layer 25, spacer layer 24, channel layer 23, buffer layer 22 and substrate 21 are partially etched in order until a predetermined portion of GaAs substrate 21 is exposed. As a result, the active region where the substrate is not etched and an isolation region where the substrate is etched are defined.

At this time, mask pattern 27 for defining the active region is comprised of a double insulating film pattern in which an oxide film and a nitride film are stacked, thereby defining the active region having a vertical etching sectional profile.

Figure 8:
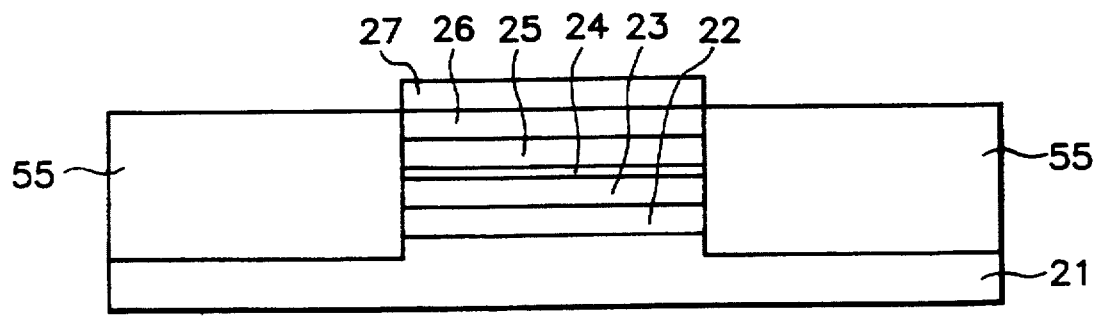

FIG. 8 shows a cross-sectional view in which the etched isolation region is selectively regrown by a MOCVD method.

Referring to FIG. 8, on exposed substrate 21, a semi-insulating film 55 is grown up to such a height as a level of ohmic layer 26, thereby planarizing the active region and the isolation region.

Figure 9:
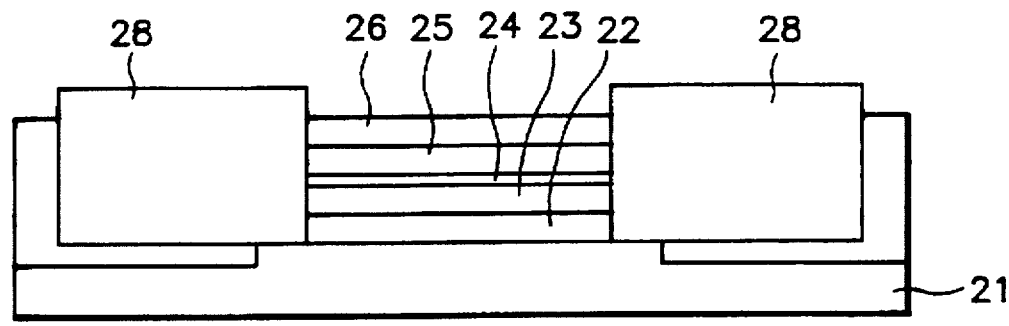

Then, as shown in FIG. 9, after removing mask pattern 27 left on ohmic layer 26, in order to form an ohmic metal layer 28 for source/drain regions, ohmic metal layer 28 is formed on a space where the semi-insulating film is regrown.

At this time, ohmic metal layer 28 is formed higher than the level of ohmic layer 26.

Figure 10:
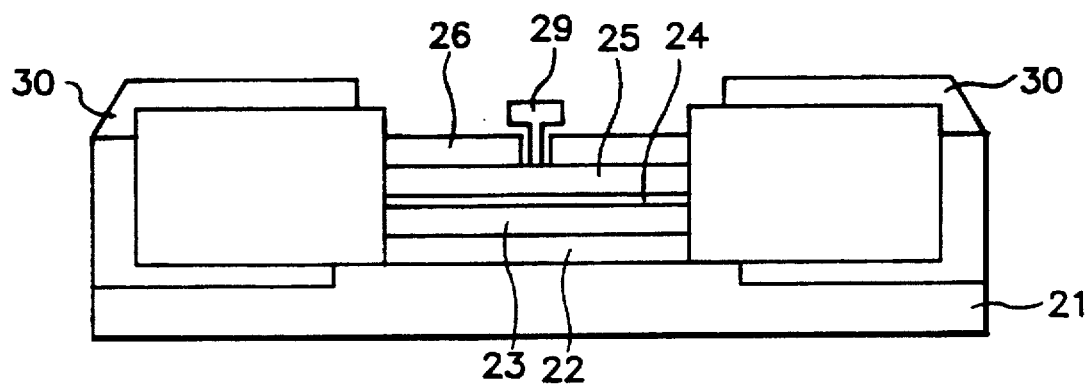

Then, as shown in FIG. 10, a predetermined region of ohmic layer 26 is removed so as to expose a part of schottky layer 25 of the active region. A gate is patterned, thereby forming a gate electrode 29 on exposed schottky layer 25 and forming source and drain electrodes 30 on the surface of ohmic metal layer 28, at the same time.

Figure 11:
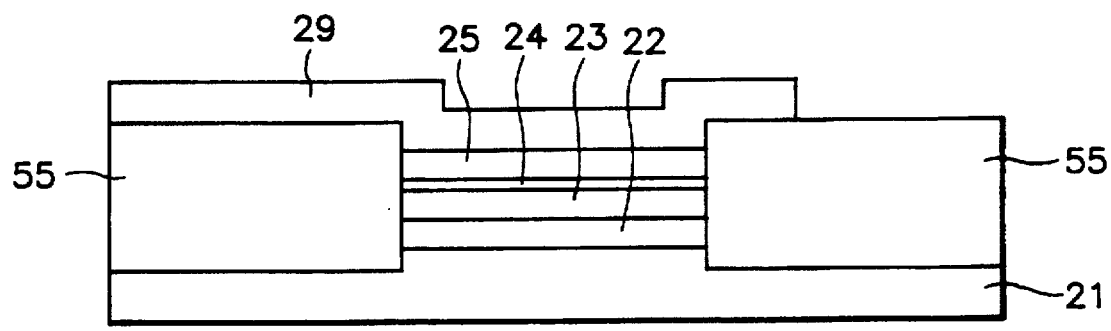

FIG. 11 is a cross-sectional view taken along the direction of gate electrode 29. This shows a sectional shape taken when gate electrode 29 passes by semi-insulating film 55 regrown on the active region and the isolation region.

As shown in FIG. 11, gate electrode 29 is not in direct contact with both sidewalls of the active region. Particularly, it is well known that gate electrode 29 is completely insulated from channel layer 23 by semi-insulating film 55.

According to such planarization of the device, it is possible to grow another layer on the regrown semi-insulating film.

For example, on the same substrate, a HEMT and a photo device, or a HEMT and a HBT can be manufactured.

As described above, according to the method for isolating a compound semiconductor device of the present invention, the isolation region is filled by the regrowth method and thus, planarized. Thus, the step-difference of the active region and the isolation region is removed.

Further, the gate line and the channel layer of the active region are electrically completely insulated from each other, thereby removing the path of a gate leakage current. Thus, the electric characteristic of the device is enhanced.

What is claimed is:

1. A method for isolating a semiconductor device, comprising the steps of:
    (a) sequentially growing a plurality of material layers on a semiconductor substrate;
    (b) etching said material layers down to a predetermined depth of said substrate, to thereby define an active region using double insulating film mask comprised of a oxide and a nitride film;
    (c) forming a semi-insulating film on said exposed semiconductor substrate in order to planarize the step-difference of said active region and an isolation region; and
    (d) forming an ohmic metal layer on a space where said semi-insulating film is regrown.

2. A method for isolating a semiconductor device as claimed in claim 1, wherein said semi-insulating film is formed by a metal organic chemical vapor deposition (MOCVD) method.

3. A method for isolating a semiconductor device as claimed in claim 1, wherein said semi-insulating film is formed to such a height as the surface of said material layers.

4. A method for fabricating a semiconductor device as claimed in claim 1, wherein said ohmic metal layer is formed higher than the surface of said semi-insulating film.

5. A method for isolating a semiconductor device as claimed in claim 1, wherein said material layers include a buffer layer, a channel layer, a spacer layer, a schottky layer, and a highly doped N-type ohmic layer.

* * * * *